United States Patent [19]

Tanski

[11] 4,409,570
[45] Oct. 11, 1983

[54] SEPARATED SUBSTRATE ACOUSTIC WAVE DEVICE

[75] Inventor: William J. Tanski, Maynard, Mass.

[73] Assignee: Sperry Corporation, New York, N.Y.

[21] Appl. No.: 322,044

[22] Filed: Nov. 16, 1981

[51] Int. Cl.³ .................. H03H 9/64; H03H 9/42; H03H 9/25; H03H 9/54
[52] U.S. Cl. .................. 333/187; 310/313 A; 333/154; 333/155; 333/195
[58] Field of Search .................. 333/150–155, 333/193–196, 141–144, 147, 187–188; 310/313 R, 313 A, 313 B, 313 C, 313 D; 29/25.35

[56] References Cited

U.S. PATENT DOCUMENTS

| 3,961,293 | 6/1976 | Hartmann et al. | 333/195 |
| 4,290,033 | 9/1981 | Kagiwada et al. | 333/141 |
| 4,330,728 | 5/1982 | Solie | 310/313 B |
| 4,349,794 | 9/1982 | Kagiwada et al. | 333/141 |

FOREIGN PATENT DOCUMENTS 2000409A 1/1979 United Kingdom ............... 333/193

OTHER PUBLICATIONS

Bond et al–"Surface Acoustic Wave Probing with Spaced Interdigital Transducers", Review Scientific Instruments, vol. 48, No. 6, Jun. 1977; pp. 682-687.

Primary Examiner—Marvin L. Nussbaum
Attorney, Agent, or Firm—Howard P. Terry

[57] ABSTRACT

A separated substrate acoustic wave device having an active piezoelectric substrate and a separate base substrate. Input and output transducers are mounted upon the base substrate. The active substrate, which includes grooved-array reflectors in the case of resonators, is mounted opposite the base substrate so that it does not contact the transducer electrodes and further so that electric fringing fields generated in the transducers will induce an acoustic wave due to the piezoelectric effect in the active substrate. Similarly, acoustic waves propagating in the active piezoelectric substrate will have an associated electric field which induces an electrical signal in the transducer permitting detection of the acoustic waves propagating in the active substrate.

12 Claims, 3 Drawing Figures

4,409,570

SEPARATED SUBSTRATE ACOUSTIC WAVE DEVICE

BACKGROUND OF THE INVENTION

1. Field of the Invention

This invention pertains to acoustic wave devices and more particularly relates to surface acoustic wave devices and shallow bulk acoustic wave devices wherein the use of separated active and base substrates permits low aging rates and low acoustic losses to be obtained.

2. Description of the Prior Art

Narrow band acoustic wave devices including surface acoustic wave (SAW) devices and shallow bulk acoustic wave (SBAW) devices must have stable long term response characteristics in order to be of general utility. Conventional SAW and SBAW devices are fabricated by placing an electro-acoustic transducer on or recessed into an active piezoelectric substrate such as quartz ($SiO_2$) on or in which propagation of the acoustic wave occurs. The electro-acoustic transducer electrodes are normally fabricated from a metal such as aluminum with a thin chrome layer for adhesion to the quartz substrate. Gold electrodes have also been used, however, gold provides a poor acoustic match to quartz thereby making acceptable response characteristics difficult to achieve.

The deposit of the metal electrodes directly onto a quartz substrate is a major source of device aging over extended periods of time. Such device aging occurs from interactions between the metal and the substrate and include stress relief and chemical changes.

It is well known in the art that stressing the acoustic substrate alters the substrate's properties, such as the elastic constants, dielectric constants, piezoelectric constants and consequently the surface acoustic wave velocity. As a result, the device's operating frequency may be undesirably affected. Thin adherent metal films are ordinarily under stress when disposited. Ordinarily the thin metal films that comprise a transducer's electrodes are deposited by techniques such as evaporation; consequently, as the metal cools it will experience thermal contractions. Since the metal adheres to the substrate, it tends to stress the substrate as it contracts. Over a period of time, depending on the degree of ductility the metal possesses, the metal will be stretched and the stress placed upon the substrate will be relaxed. The mechanical properties of the surface of the acoustic substrate may thus change and as a result, the acoustic wave device's operating characteristics may also change. Additionally, micro-cracks which may be present in the substrate material during fabrication may further propagate throughout the crystal substrate due to strain on the substrate. These micro-cracks may also change the acoustic wave device's characteristics, and possibly lead ultimately to failure of the device. Chemical changes will also change the characteristics of the substrate. Such chemical changes include the formation of metal oxides and reduction of the quartz to silicon in the vicinity of the metallized electrodes.

Changes in metal films will also occur due to electromigration of the metal and stress induced metal migration. Actual migration of metal atoms along grain boundaries in the direction of an electric field have been observed and similar metal migration has been observed in the presence of dynamic stresses. All of the above changes cause variations in the acoustic propagation path with a resultant change in device operating frequency and frequency response.

Prior art methods for reducing such aging effects have included the use of different metals. Gold is one metal which has been used in an attempt to overcome aging effects. Since gold is considerably more ductile than metals such as chromium or aluminum, aging due to stress relief is decreased. Furthermore, since gold is more inert than aluminum, chemical reduction of the quartz substrate and other chemically induced effects are minimized. Gold, however, as stated previously, provides a poor acoustic match to quartz and for this reason does not provide a completely satisfactory solution to the problem of aging.

Acoustic devices such as SBAW filters and SAW devices suffer appreciable acoustic losses as a wave travels from the electroded area to the free surface of the substrate due to the mass loading effect of the transducers. Furthermore, in SBAW filters in which acoustic waves are launched at an angle slightly depressed from the surface of the substrate, acoustic losses can be even more severe due to end effects of the transducers. In both SAW and SBAW devices such acoustic losses which result from the placement of the transducer on or in the surface of the active substrate cause a diminution of available signal energy and are hence undesirable.

The present invention provides acoustic wave devices in which aging effects due to the metallization of the active substrate and acoustic losses due to the metallization of the active substrate are eliminated using fabrication techniques adaptable to those in the known art.

SUMMARY OF THE INVENTION

An acoustic wave device embodying the principles of the present invention has reduced aging rates and acoustic losses in comparision to conventional devices. Reduction of aging rates and acoustic losses are achieved by removing the transducer electrodes from the piezoelectric surface. The present invention comprises a base substrate to which are affixed transducers and an active piezoelectric substrate opposite to the base substrate and in energy coupling, non-contacting relation with the transducers. Electrical signals applied to the transducer will induce an acoustic wave in the active substrate, which acoustic wave may be detected by a transducer in the base substrate.

DESCRIPTION OF THE PREFERRED EMBODIMENT

Figure 1:
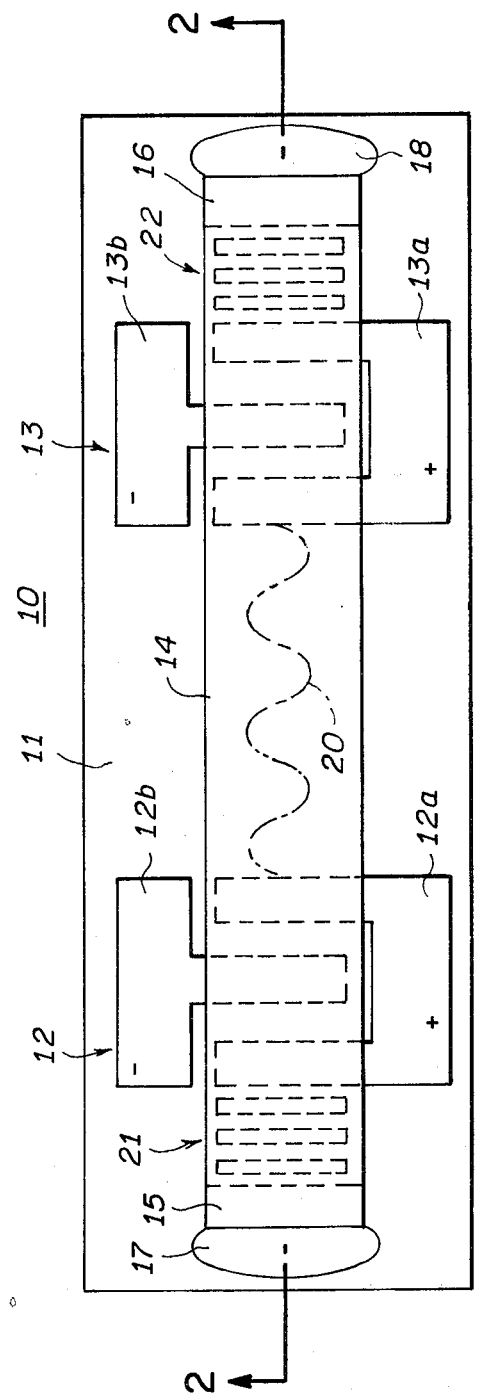
FIG. 1 is a representation of a separated substrate acoustic wave device according to the present invention.

Refer now to FIG. 1. An acoustic wave device 10 according to the present invention includes a base substrate 11 having interdigital transducers 12 and 13 disposed thereon for the reception and launching of acoustic waves. Active piezoelectric substrate 14 is disposed over and aligned with transducers 12 and 13 and separated from base substrate 11 by separation rails 15 and 16. Active piezoelectric substrate 14 may be bonded to base substrate 11 and separation rails 15 and 16 by adhesives 17 and 18. As will be further explained hereinbelow, surface acoustic waves or shallow bulk acoustic waves 20 propagate on and in active substrate 14. Active substrate 14 may further include reflector grooved arrays 21 and 22 for the case of SAW resonators.

Figure 2:
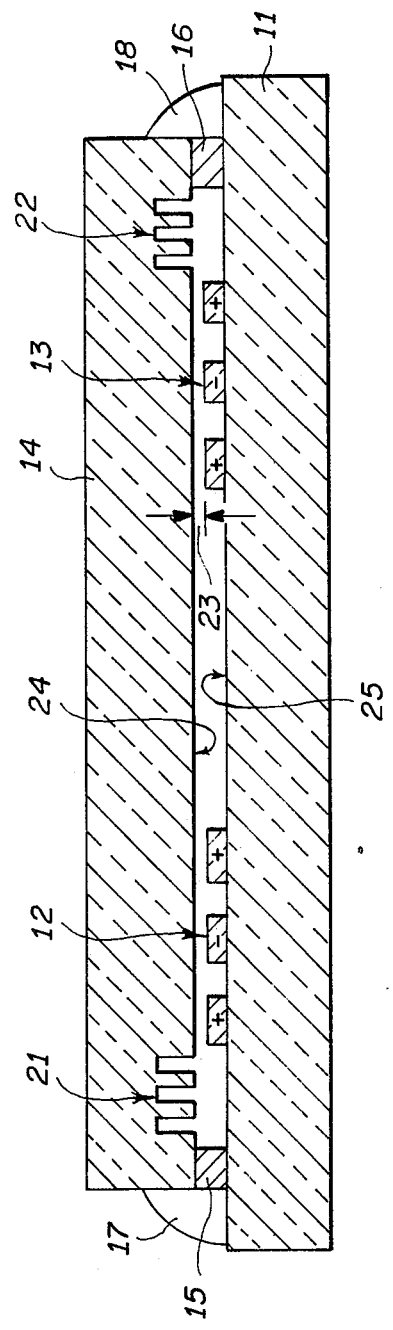
FIG. 2 is a cross-sectional view of the device of FIG. 1.

Refer now to FIG. 2 wherein the apparatus of FIG. 1 is shown in cross-section 2—2. Active substrate 14 is separate from interdigital transducers 12 and 13 by a distance 23. In practice, distance 23 is desirably on the order of several hundred Angstroms.

Figure 3:
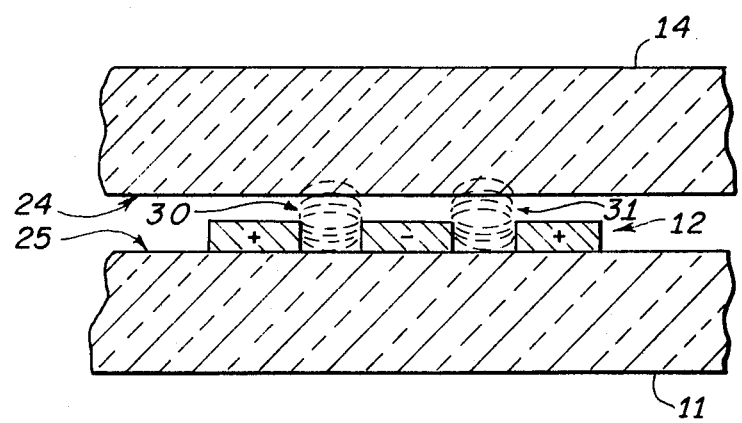
FIG. 3 is a diagram useful in the explanation of the operation of the present invention.

In operation, an electric signal is applied across electrodes 12a and 12b of transducer 12. Refer now to FIG. 2 wherein a portion of the transducer of FIG. 3 is shown. Electric fringing fields 30 and 31 are generated across the plus and minus terminals corresponding respectively to electrodes 12a and 12b of interdigital transducer 12 when an electrical signal is supplied thereto. Electric fields 30 and 31 generated between electrodes 12a and 12b of the interdigital transducer will intersect substrate 14 which is fabricated from a piezoelectric material, thereby producing therein mechanical or acoustic waves as a result of the piezoelectric effect. Thus acoustic wave 20 propagates along active substrate 14 in the same manner that acoustic waves propagate in the substrate of conventional acoustic wave devices. In the case of surface acoustic wave devices, active substrate 14 is selected and oriented so that acoustic wave 20 propagates along the surface 24 in the same manner as in conventional SAW devices. In the case of shallow bulk acoustic wave devices active substrate 14 is selected and oriented so that after launching from transducer 12 into active substrate 14, the acoustic wave will follow a path at a shallow angle from the surface 24 and into the bulk of the substrate.

Acoustic wave 20 propagating in or on active substrate 14 will have an electric field associated therewith due to the piezoelectric effect. In the vicinity of transducer 13, the electric field associated with acoustic wave 20 will be impressed across electrodes 13a and 13b of transducer 13 inducing an electrical signal therein. In such manner, an acoustic wave may be launched into and detected from active substrate 14. Removal of transducers 12 and 13 from the surface of active substrate 14 eliminates aging and acoustic loss effects that would otherwise result from intimate contact between the metal of the transducers and the acoustic substrate.

For resonators, the active substrate contains reflector grooved arrays 21 and 22 as shown; furthermore, the transducers must be accurately positioned in the cavity formed by the adjacent reflectors. Resonators may also be fabricated using only a single transducer, for example, 12 positioned in the cavity formed by grooved arrays 21 and 22, in the manner known in the art for conventional SAW resonators. For resonators both angular alignment and longitudinal alignment of the active substrate containing the grooved arrays 21 and 22 with respect to transducers 12 and 13 is necessary. For delay line type SAW as well as SBAW devices only the angular orientation of active substrate 14 with respect to transducers 12 and 13 is important.

It will be clear to those skilled in the art that other transducer configurations, such as recessed and split electrodes also work well in the present invention.

Active substrates 11 and 14 should be chosen to have identical or substantially identical thermal expansion coefficients in the direction of propagation in order that changes in temperature shall not cause differential expansions and contractions and thus cause undue stresses which may affect the device's frequency characteristics or lead to substrate fracture and failure of the device. Typically, the direction of propagation is parallel to the longitudinal axis of the active substrate. In one embodiment of the invention, substrates 14 and 11 are chosen from the same piezoelectric material, for example, ST cut quartz, using gold electrodes on the base substrate. Such a construction would insure absolute thermal compatibility and identical values for thermal expansion coefficients $\alpha$.

In general, it is not desirable to launch an acoustic wave on base substrate 11 since any acoustic wave launched therein will be detected along with the desired acoustic wave 20. Gold, however, is previously discussed, provides an inherently poor acoustic match to quartz and will therefore cause the acoustic response due to the piezoelectric base substrate to be on the order of 4% lower in frequency than the acoustic response of the active substrate. In a resonator, having all reflecting grooves on the active substrate and no reflecting grooves on the base substrate, there would be no resonance in the base substrate and hence the frequency response associated with the base substrate would have a much higher insertion loss than the frequency response of the active substrate. Conventional electrical matching and filtering techniques may also be used to further discriminate against the resulting lower amplitude and lower frequency base substrate acoustic waves. The signals are thus separable from the desired acoustic wave 20 or ignorable.

In delay line SAW as well as SBAW filters, since resonance does not come into play in either the active substrate or the base substrate, in order for the acoustic waves launched in the base substrate to be separable from those launched in the active substrate, the base substrate acoustic waves may need to be more than 4% lower in frequency than those in the active substrate. Such further reduction in frequency may be achieved using thicker gold electrodes commensurate with the device frequency.

If the two substrates are bonded firmly together as shown in FIGS. 1 and 2, a base substrate having the same or substantially the same thermal expansion coefficient in the direction of propagation of acoustic wave 20 is desirable to minimize stresses due to differential expansion and contraction. For both SAW and SBAW delay line filters, materials, such as an appropriate or amorphous material cut of crystal, having little or no piezoelectric response and expansion coefficients approximately equal to that of the active substrate used are clearly desirable. One commonly used cut of quartz for SAW devices is the ST-X cut which has an $\alpha_t = 13.7 \times 10^{-6}/$ degree c. The Y-axis of quartz has substantially the same thermal expansion coefficient as the X-axis. Quartz, for example, is an anisotropic medium having differing acoustic wave propagation characteristics along different axes of its crystalline structure. The Z-cut plate having propagation in the Y direction has, however, a piezoelectric coupling factor less than half that of the ST-X cut and a velocity 20% higher. The Z-cut would thus be suitable for use as passive substrate 11 where electrodes 12 and 13 are of aluminum, and would be particularly useful for either SAW or SBAW delay line filters, as well as the SAW resonators. Since the amplitude of acoustic waves in the base substrate would be substantially less than those in the active substrate, and also be of a significantly higher frequency, the base substrate acoustic waves may be readily separated from the active substrate acoustic waves.

Separation rails 15 and 16 may be of a metal such as gold or aluminum deposited on the active substrate or on the base substrate depending on which is simpler to implement. Separation rails 15 and 16 may also be comprised of the same material as active substrate 14. This may be accomplished by etching away the delay line area between separation rails 15 and 16, thus leaving protrusions of the active substrate to achieve the required separation. Furthermore, interdigital transducers 12 and 13 may be recessed into the base substrate and the active substrate placed directly onto the base substrate.

Another alignment as well as longitudinal alignment of the active and base substrates may be accomplished by viewing patterns through the active substrate, providing the top surface is polished and suitable alignment structures have been included in the pattern.

Cleaning carbonaceous material from opposing surfaces 24 and 25 of active substrates 14 and 11 respectively may be performed by exposure to ultraviolet light in an oxygen or $O_2$ atmosphere. Ultraviolet light is transmitted through quartz with little attenuation, and as is well known in the art, carbon compounds oxidize when exposed to an oxidizing atmosphere in the presence of ultraviolet radiation.

It should be clear to those skilled in the art that encapsulation and lead bonding techniques for the separated substrate acoustic wave devices fabricated in accordance with the present invention are substantially the same as those for conventional devices. It should be further clear to those skilled in the art that fabrication techniques and equipment known in the art and used for the fabrication of conventional SAW devices, may be readily adapted to the construction of separated substrate acoustic wave devices in accordance with the principles of the present invention.

While the invention has been described in its preferred embodiment, it is to be understood that the words which have been used are words of description rather than limitation and that changes may be made within the purview of the appended claims without departing from the true scope and spirit of the invention in its broader aspects.

I claim:

1. A shallow bulk acoustic wave delay filter, including:
   a base substrate having a first surface;
   active piezoelectric substrate means for propagating acoustic waves therein, said active means having a first surface disposed adjacent to and opposite from said base substrate first surface;
   transducer means affixed to said base substrate first surface in energy coupling non-contacting relation to said active substrate for coupling energy between said transducer means and said active substrate; and
   means for separation disposed between said active substrate and said base substrate for fixing a separation distance between said active substrate first surface and said base substrate first surface.

2. A surface acoustic wave resonator including:
   a base substrate having a first surface;
   active piezoelectric substrate means for propagating acoustic waves therein, said active substrate means having a first surface disposed adjacent to and opposite from said base substrate first surface;
   transducer means affixed to said base substrate first surface in energy coupling non-contacting relation to said active substrate for coupling energy between said transducer means and said active substrate;
   means for separation disposed between said active substrate and said base substrate for fixing a separation distance between said active substrate first surface and said base substrate first surface; and
   means for reflecting surface acoustic waves propagating within said active substrate.

3. The apparatus according to claim 2 wherein said means for reflecting comprise grooves in said active substrate.

4. The apparatus according to claims 1 or 2 wherein:
   said active substrate and said base substrate have substantially identical thermal expansion coefficients and acoustic wave propagation properties; and
   said tranducers are comprised of materials having substantially different acoustic properties from said base and active substrate material.

5. In a surface acoustic wave delay line filter including:
   a base substrate having a first surface;
   active piezoelectric substrate means for propagating acoustic waves therein, said active substrate means having a first surface disposed adjacent to and opposite from said base substrate first surface;
   transducer means affixed to said base substrate first surface in energy coupling non-contacting relation to said active substrate for coupling energy between said transducer means and said active substrate; and
   means for separation disposed between said active substrate and said base substrate for fixing a separation distance between said active substrate first surface and said base substrate first surface; the improvement wherein
   said active substrate and said base substrate have substantially identical thermal expansion coefficients and acoustic wave propagation properties; and
   said transducers are comprised of materials having substantially different acoustic properties from said base and said active substrate material.

6. The apparatus according to claim 1, 2, or 5 wherein said base substrate and said active substrate comprise ST-X cut quartz; and said transducers are comprised of gold.

7. The apparatus according to claim 1, 2, or 5 wherein:
   said active substrate and said base substrate have substantially identical thermal coefficients of expansion along a first longitudinal axis in the direction of propagation of said acoustic waves in said active substrate and differing acoustic wave propagation characteristics along said longitudinal axis; and
   said transducer means are comprised of material having acoustic properties substantially matched to said acoustic properties of said active substrate.

8. The apparatus according to claim 7 wherein said active substrate comprises ST-X cut quartz, the X direction of which is aligned with said longitudinal direction; and
   said base substrate comprises Z-cut quartz, and Y direction being aligned parallel to said longitudinal axis; and
   said transducers are comprised of aluminum.

9. The apparatus according to claims 1, 2 or 5 wherein said separation means are comprised of gold.

10. The apparatus according to claims 1, 2 or 5 wherein said separation means are comprised of aluminum.

11. The apparatus according to claims 1, 2 or 5 wherein said separation means are comprised of protrusions of said active substrate, said protusions being formed by etching selected areas of said active substrate to a depth equal to said separation distance.

12. The apparatus according to claim 1, 2 or 5 further including adhesive bonding between said active substrate, said separation means and said base substrate.

* * * * *